United States Patent [19]

Van Lehn et al.

[11] Patent Number: 4,731,553

[45] Date of Patent: Mar. 15, 1988

[54] CMOS OUTPUT BUFFER HAVING IMPROVED NOISE CHARACTERISTICS

[75] Inventors: David A. Van Lehn; Edward H. Flaherty, both of Houston, Tex.

[73] Assignee: Texas Instruments Incorporated, Dallas, Tex.

[21] Appl. No.: 913,783

[22] Filed: Sep. 30, 1986

[51] Int. Cl.$^4$ .................. H03K 19/094; H03K 19/003
[52] U.S. Cl. ................................. 307/443; 307/270; 307/451; 307/579
[58] Field of Search ............... 307/443, 475, 448, 451, 307/263, 268, 270, 579, 585

[56] References Cited

U.S. PATENT DOCUMENTS

| | | | |
|---|---|---|---|
| 4,329,600 | 5/1982 | Stewart | 307/571 |
| 4,477,741 | 10/1984 | Moser, Jr. | 307/443 |
| 4,553,043 | 11/1985 | Parker | 307/443 |
| 4,626,712 | 12/1986 | Ozawa | 307/475 |
| 4,638,187 | 1/1987 | Boler et al. | 307/579 |

OTHER PUBLICATIONS

Walters, Jr. et al., "LAN System Interface Chip with Selectable Bus Protocols", 1985 IEEE ISSC Conference, pp. 190–191.

Primary Examiner—Stanley D. Miller
Assistant Examiner—Timothy P. Callahan
Attorney, Agent, or Firm—John G. Graham; Rodney M. Anderson

[57] ABSTRACT

A CMOS output buffer circuit which as improved noise characteristics is disclosed. The circuit has two stages, one having relatively fast response time for causing the output node to make a quick logic transition, and the other stage for providing steady-state drive of the output node. The transistors in the transition-driving stage are driven from power supply and reference supply nodes which are isolated from the power supply and reference supply nodes of the steady-state stage. For a low-to-high transition, the driving transistor in the steady-state stage, being p-channel, drives the output node to a full power supply level, which causes the driving transistor in the transition-driving stage to turn off, isolating the two power supply nodes of the two stages from one another. For a high-to-low transition, a feedback circuit serves to turn off the pull-down transistor of the transition-driving stage in order to isolate the two reference supply nodes of the two stages from one another. The steady-state stage is delayed, so that the noise from the initial transition does not appear at the power supply and reference supply nodes of the steady-state stage. The circuit also operates so that the output node can be put into a high-impedance state, allowing for common input/output utilization of the circuit.

13 Claims, 3 Drawing Figures

CMOS OUTPUT BUFFER HAVING IMPROVED NOISE CHARACTERISTICS

BACKGROUND OF THE INVENTION

The invention is directed to integrated circuits, and more specifically to improved output driver circuits in integrated circuits manufactured using CMOS technology.

Integrated circuits which operate as logic circuits, including such LSI and VLSI circuits as microprocessors, microcomputers, and memories, present digital logic signals at their output. The desired output waveform of the transition of such digital logic signals going from a "0" logic state to a "1" logic state, or vice versa, is a step function, i.e., a square transition occurring in zero time. A rapid transition providing sufficient sink or source current is desired, of course, since the faster that an output circuit can provide a transition, the faster the receiving circuit can respond to the transition. However, the realization of such a logic transition in actual circuits provides a waveform having a non-zero rise or fall time, and having varying degrees of overshoot and undershoot, such overshoot and undershoot appearing not only at the output terminal, but also as noise on the power supply nodes and buses. Generally, as the desired speed of operation of circuits performing digital logic functions increases, the amplitude of such overshoot and undershoot increases, causing the circuit designer to make a tradeoff between the switching speed (and drive capability) of an output buffer circuit versus the amplitude of the noise generated by the output buffer circuit.

It is further useful, especially in VLS1 logic circuits, to provide digital output in a parallel manner, i.e., a plurality of digital output signals occurring at approximately the same time. In such a parallel arrangement, it is convenient to share power supply buses among the individual output buffers in order to conserve chip area. However, the sharing of power supply buses among output buffer circuits allaows the overshoot and undershoot at the power supply node of a switching output buffer to couple to the power supply node of a neighboring output buffer which is not switching. If the amplitude of the switching noise is sufficient, disruption of the output of the non-switching buffer may occur. In addition, circuits other than output buffers may also be sharing the power supply buses, and therefore may be disrupted by the switching noise of an output buffer. As a result, the trend of incorporating more and more logic functions into single integrated circuits, said functions necessarily being closer together, increases the sensitivity of integrated circuits to switching noise.

In addition, many such circuits are preferably constructed using CMOS (complementary metal-oxide-semiconductor) technology, because of the reduced power consumption and increased switching speed of digital logic circuits using CMOS technology. The use of CMOS in the construction of logic circuits further provides the ability to incorporate more logic functions into a semiconductor device of a given size, further increasing the amplitude of, and sensitivity to, such outpuyt overshoot and undershoot.

Prior techniques for dealing with this problem have included the use of separate ground nodes in an n-channel push-pull MOS output buffer, one of said ground nodes for sinking current during the initial transition from a high output state to a low output state, and the other for sinking DC current during the steady state condition of a low output state. Such an output buffer is shown and described in "A LAN System Interface Chip with Selectable Bus Protocols", by Donald Walters, Jr. et al., 1985 *Digest of Technical Papers,* 1985 *IEEE International Solid-State Circuits Conference* (IEEE, 1985), pp. 190–191. The separate ground nodes allow the DC ground node to sink output current without having the undershoot associated with the original transition coupled to it. However, the use of n-channel technology inherently precludes the circuit described in this paper from driving a "1" logic state to the full level of the biasing power supply, since the n-channel pull-up transistor will turn off as the output terminal of the circuit reaches a voltage greater than the blasing power supply voltage less a transistor threshold voltage. While further prior techniques have provided the use of a transistor in series between the output terminal and the drain of the pull-down transistor to damp the undershoot generated by a high-to-low transition, such a technique is ineffective for low-to-high transitions; if used in the pull-up side of an NMOS output buffer, the n-channel pull-up transistor would switch off a even a lower voltage, further reducing the drive level and increasing the switching time.

It is therefore an object of this invention to provide an output buffer circuit, useful in integrated circuits performing digital logic functions, which provides a fast logic transition in both directions, with overshoot and undershoot greatly reduced over prior output buffer circuits.

It is a further object of this invention to provide an output buffer which is capable of driving the output terminal fully to the voltage of the biasing power supply, but with reduced overshoot.

It is a further object of this invention to provide an output buffer which, when used in a parallel arrangement with other such output buffers, will isolate the power supply nodes of those output buffers which remain in a given output state from the noise created by neighboring output buffers which are making a logic transition.

It is a further object of this invention to provide an output buffer circuit manufacturable using CMOS technology.

It is a further object of this invention to provide an output buffer circuit which allows for the output waveform to be shaped in such a manner as to reduce the radio frequency interference (RFI) emanating from an integrated circuit using said output buffer.

Other objects and benefits of this invention will be apparent to those skilled in the art, based upon the description to follow herein.

SUMMARY OF THE INVENTION

The invention may be incorporated in an output buffer circuit, constructed according to CMOS technology, where the bias power supply is available at two separate nodes, and where the reference supply is also available at two separate nodes. The data input signal is received by the gates of a first pair of driver transistors, having their source-to-drain paths connected in series between a first bias power supply node and a first reference node, the output of the circuit being at the point between the source-to-drain paths of the two transistors. One of these two driver transistors will conduct, depending upon the logic state of the input, which will in turn draw the output node to either the first bias power supply node or to the first reference supply node. Further incorporated into the output buffer circuit is a second pair of driver transistors, which are of different conductivity-types, which have their source-to-drain paths connected between the second bias power supply node and the second reference supply node, and which have their gates coupled to the input node through delay stages. The operation of the second pair of driver transistors is delayed so that the output node is quickly charged by the appropriate one of the driver transistors; once the second pair of driver transistors operates, though, the driver transistor which was conducting is cut off either by the inherent operation of one of the inverter transistors or by way of a feedback circuit. Since the bias power supply nodes and reference supply nodes for the first pair of driver transistors are isolated from the second pair of driver transistors, the overshoot or undershoot of the logic transition is minimized as the second pair of driver transistors drives the output node of the circuit.

DETAILED DESCRIPTION OF THE PREFERRED EMBODIMENT

Figure 1:
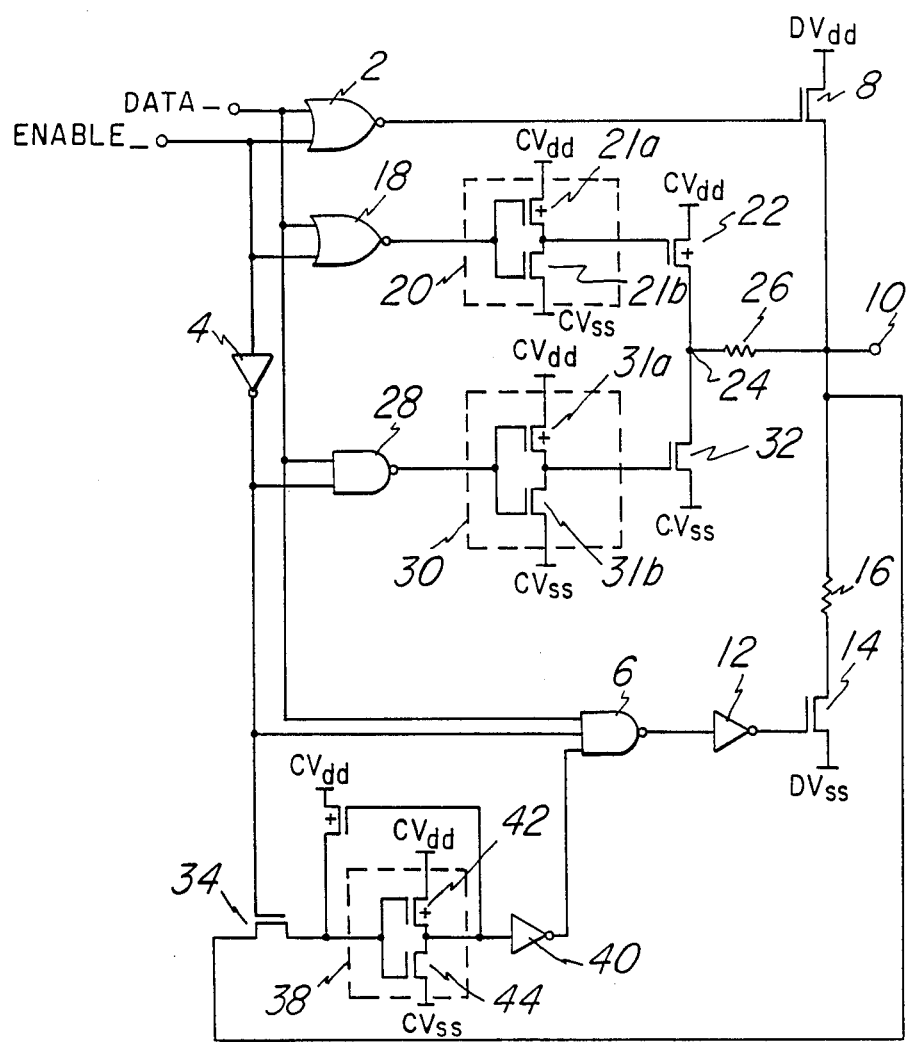
FIG. 1 is an electrical diagram, in schematic form, of an output buffer circuit constructed according to the invention.

Referring to FIG. 1, a CMOS output buffer constructed according to the invention will be described. NOR gate 2 receives at its inputs data input signal DATA__ and enable signal ENABLE__ (the __ designator after the signal name representing a negative logic signal). Data signal DATA__ is shown as having negative logic values, as will be evident below, as the signal at output terminal 10 will correspond to the logical complement of data signal DATA__. The output of NOR gate 2 is connected to the gate of n-channel transistor 8, which has its drain connected to power supply node $D_{Vdd}$ is biased to supply voltage $V_{dd}$, which is a positive voltage such as +5 volts, in the embodiment of FIG. 1, Similarly, enable signal ENABLE__ (inverted by inverter 4) and data signal DATA__ are connected to the inputs of NAND gate 6. The output of NAND gate 6 is connected, through inverter 12, to the gate of n-channel transistor 14. The source of transistor 14 is connected to reference node $D_{Vss}$, and the drain of transistor 14 is connected, through resistor 16, to output terminal 10. Reference supply node $D_{Vss}$ is biased to supply voltage $V_{ss}$, which is at zero volts in the embodiment of FIG. 1.

Data signal DATA__ and enable signal ENABLE__ are also connected to the inputs of NOR gate 18. The output of NOR gate 18 is connected, through inverter 20, to the gate of p-channel transistor 22. Transistor 22 has its source connected to power supply node $C_{Vdd}$, and has its drain connected to intermediate output node 24. Power supply node $C_{Vdd}$, similarly as power supply node $D_{Vdd}$, is biased to supply voltage $V_{dd}$, but is electrically isolated from power supply node $D_{Vdd}$. Intermediate output node 24 is connected to output terminal 10 via resistor 26. Similarly, enable signal ENABLE__ (after being inverted by inverter 4) and data signal DATA__ are connected to the inputs of NAND gate 28. The output of NAND gate 28 is connected, via inverter 30, to the gate of n-channel transistor 32. Transistor 32 has its drain connected to intermediate output node 24, and its source connected to reference node $C_{Vss}$. Reference node $C_{Vss}$ is biased to supply voltage $V_{ss}$, and similarly as power supply nodes $D_{Vdd}$, and $C_{Vdd}$, is electrically isolated from reference node $D_{Vss}$.

Inverters 20 and 30 are CMOS inverters. Inverter 20 is made up of p-channel transistor 21a and n-channel transistor 21b. The source of transistor 21a is connected to power supply node $C_{Vdd}$ and the source of transistor 21b, is connected to reference supply node $C_{Vss}$; the drain of transistor 21a is connected to the drain of transistor 21b at the output of inverter 20. The gates of transistors 21a and 21b are connected together, and serve as the input to inverter 20. As will be discussed relative to the operation of the circuit hereinbelow, it is desirable that inverter 20 perform the low-to-high transition (at its output) more quickly than it performs the high-to-low transition. Accordingly, p-channel pull-up transistor 21a has a significantly larger channel width-to-length ration than n-channel pull-down transistor 21b, causing transistor 21a to have a larger gain than transistor 21b. Inverter 30 is also a CMOS inverter, similarly constructed as inverter 20, having p-channel transistor 31a and n-channel transistor 31b biased between power supply node $C_{Vdd}$ and reference supply node $C_{Vss}$. As will also be discussed below, it is desirable that inverter 30 perform the high-to-low transition at its output more quickly than it performs the low-to-high logic transition. Conversely, relative to inverter 20, the n-channel pull-down transistor 31b will have a significantly larger channel width-to-length ratio than p-channel pull-up transistor 31a, causing transistor 31b to have a higher gain than transistor 31a.

Feedback from output terminal 10 is accomplished via the connection of output terminal 10 to the source of n-channel transistor 34. The drain of transistor 34 is connected to inverter 38 and to the drain of p-channel transistor 36. The gate of transistor 34 is connected to the output of inverter 4, and the source of transistor 36 is connected to power supply node $C_{Vdd}$. During thX operative mode of the device, with enable signal ENABLE__ in its low state, the gate of transistor 34 will be at a voltage substantially at $V_{dd}$. The gate of transistor 36 is connected to the output of inverter 38; the output of inverter 38 is also connected to the input of inverter 40. The output of inverter 40 is connected to a third input of NAND gate 6.

As shown in FIG. 1, inverter 38 is a CMOS inverter, comprised of p-channel transistor 42 and n-channel 44. The source-to-drain paths of transistors 42 and 44 are biased between power supply node $C_{Vdd}$ and reference node $C_{Vss}$. N-channel transistor 44 in the preferred embodiment of the invention shown in FIG. 1, has a channel width-to-length ratio significantly greater than that of p-channel transistor 42, not only so that it has a greater gain than transistor 42 but also so that the switching voltage of inverter 38 is close to zero volts. As is well known in the art, the relative width-to-length ratio of the two transistors in a CMOS inverter, among other factors, can control the value of the input voltage at which both transistors in the CMOS inverter saturate, i.e., the switching voltage of the inverter. As well be discussed below, the switching voltage of inverter 38 is preferably near zero volts in order to perform the desired function of the feedback circuit in FIG. 1.

Inverter 40 is also preferably a CMOS inverter, but need not necessarily have its switching voltage near zero volts for the output buffer circuit to have the advantages of the invention. However, the p-channel pull-up transistor and n-channel pull-down transistors which comprise inverter 40 may be sized to provide the desired delay from the feedback circuit in turning transistor 14 off. For example, to increase the delay in turning off transistor 14 after output terminal 10 has been pulled towards $D_{Vss}$, the p-channel pull-up transistor in inverter 40 may be sized to have a significantly greater channel width-to-length ratio relative to the n-channel pull-down transistor in inverter 40. Conversely from inverter 38, this will cause the switching voltage of inverter 40 to move toward $C_{Vdd}$, and will therefore require the output of inverter 38 to be closer to $V_{dd}$ before inverter 40 switches logic states at its output.

Inverters 4 and 12 may also be CMOS inverters, but the switching characteristics of said inverters need not necessarily be asymmetrical in either direction. It is indeed preferable that the switching characteristics of said inverters 4 and 12 are symmetrical, so that the switching voltage is equidistant between the bias voltages $V_{dd}$ and $V_{ss}$.

It should be further noted that transistors 8, 14, 21a, 21b, 22, 31a, 31b, 32, 34, 36, 42 and 44 are all enhancement mode transistors, thereby having a threshold voltage $V_t$ greater than zero. The designation $V_t$ in this specificatiXn also includes the effect of the substrate bias on the operation of the transistors. well-known in the art as the body effect. The source-to-drain paths of said transistors therefore are relatively conductive when the gate-to-source voltage exceeds $V_t$, and relatively non-conductive when the gate-to-source voltage does not exceed $V_t$. For purposes of explanation of the operation of the embodiment of the invention shown in FIG. 1, $V_t$ for each of these transistors will be assumed to be equal. Of course, the features and benefits of the invention will be applicable to a circuit wherein the threshold voltages of the transistors therein are not all equal.

Figure 2A:
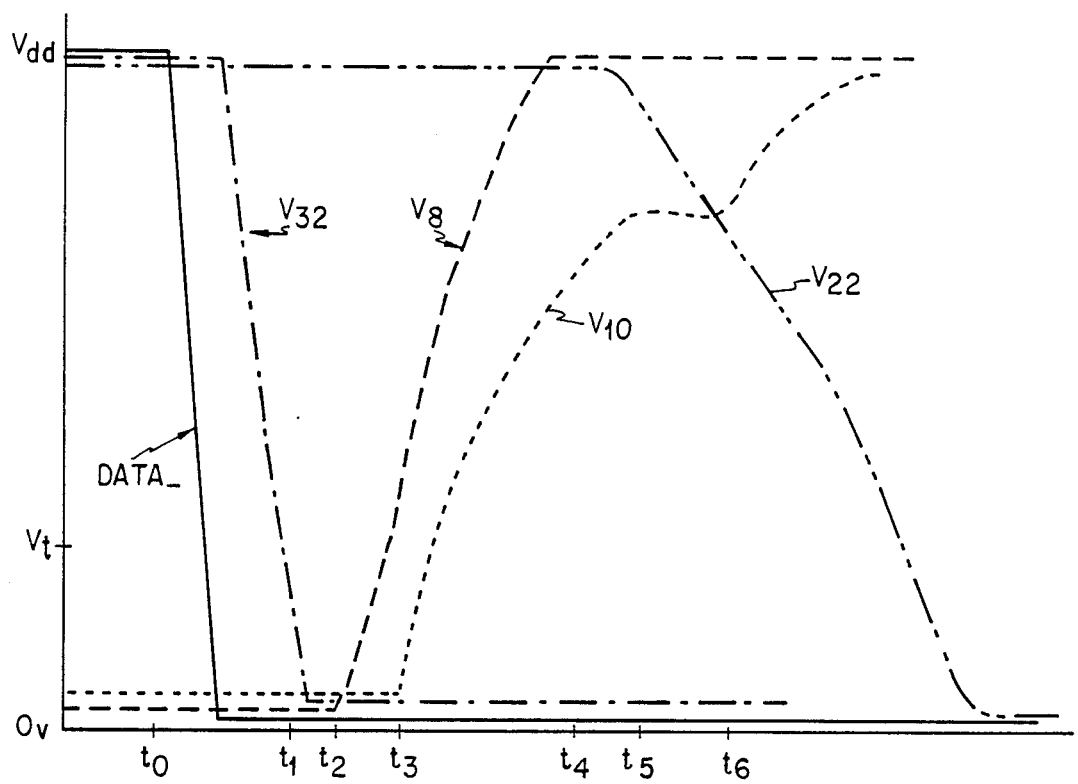
FIG. 2a is a diming diagram, representativ eof voltage over time, illustrating the operation of the output buffer circuit of FIG. 1 in the case where the output goes from a low logic state to a high logic state.

The operation of the circuit shown in FIG. 1 will now be described in detail. Referring to FIG. 2a, a timing diagram of certain voltages in the circuit of FIG. 1 is illustrated, in the case where data signal DATA_ is making a high to low logic transition, and thereby where the output of the circuit is making a low to high logic transition. It is presumed that, during the period of operation shown in FIGS. 2a and 2b, enable signal ENABLE_ is remaining at a low logic level. In this way, NOR gates 2 and 18 will act as inverters, both logically inverting data signal DATA_. NAND gate 28 will similarly act to logically invert data signal DATA_, enable signal ENABLE_ being inverted by inverter 4 prior to its input into NAND gate 28.

In FIG. 2a, data signal DATA_ is shown at time $t_0$ as beginning a transition from a high logic level near $V_{dd}$, to a low logic level near $V_{ss}$. At time $t_1$, the gate of transistor 32 begins making a high-to-low logic transition, since data signal DATA_ is twice inverted by the operation of NAND gate 28 and inverter 30; this is shown by the signal waveform in FIG. 2a labeled $V_{32}$. As discussed above, n-channel pull-down transistor 31b is a relatively large device, causing the gate of transistor 32 to quickly pull down to approximately $V_{ss}$ and thereby quickly turning off transistor 32. It is important that transistor 32 be turned off prior to transistor 8 being turned on, in order to prevent a DC current path between $D_{Vdd}$ and $C_{Vss}$ should both transistor 8 and transistor 32 be on at the same time. Since transistor 22 is still off from the prior cycle, intermediate output node 24 is floating subsequent to transistor 32 turning off at time $t_1$. NOR gate 2, after its internal delay in inverting data signal DATA_, drives the voltage at the gate of transistor 8 to a high level, shown in in FIG. 2a as the waveform labeled as $V_8$, and beginning at time $t_2$. After the voltage at the gate of transistor $V_8$ exceeds its threshold voltage $V_t$ (at time $t_3$ in FIG. 2a), transistor 8 begins driving output terminal 10 toward $V_{dd}$, sourced by power supply node $DV_{dd}$. The shape of waveform $V_{10}$, representing the voltage at output terminal 10, is dependent primarily on the load presented to the output buffer circuit. However, since the gate of transistor 8 is at approximately $V_{dd}$, transistor 8 can only drive the voltage of output terminal 10 to a level of $V_{dd}$ less $V_t$, before transistor 8 is cutoff. This is shown as occurring by waveform $V_{10}$ flattening at approximately $V_{dd}-V_t$, at time $t_5$ in FIG. 2a.

As discussed above, n-channel transistor 21b is relatively small, and therefore the output of inverter 20 responds relatively slowly to the high-to-low transition of data signal DATA_ (compared, for example, to the response of inverter 30 to the high-to-low transition of data signal DATA_). As a result, the voltage at the gate of transistor 22 (represented in FIG. 2a as waveform $V_{22}$) begins falling from near $V_{dd}$ toward $V_{ss}$ at time $t_4$, delayed from the energizing of transistor 8 by NOR gate 2. As the voltage $V_{22}$ at the gate of transistor 22 falls below $V_{dd}$ (the voltage at the source of transistor 22, i.e., at power supply node $C_{Vdd}$) by more than the threshold voltage $V_t$ of transistor 22. transistor 22 will begin driving intermediate output node 24 toward $V_{dd}$. In FIG. 2a, the point at which transistor 22 begins to drive intermediate output node 24 is shown at time $t_6$. Subsequent to this time, the source of transistor 8 (output terminal 10) will rise to less than a threshold voltage $V_t$ of the gate voltage $V_8$; at this point, transistor B will cease driving output terminal 10, and output terminal 10 will be driven solely by transistor 22 from power supply node $C_{Vdd}$, through resistor 26. Since transistor 22 is a p-channel transistor, it can drive intermediate output node 24 (and, accordingly, output terminal 10) to a full $V_{dd}$ level, because transistor 22 is operating in its saturation region when its gate voltage is more than a threshold voltage $V_t$ less than its source voltage (power supply node $C_{Vdd}$) and its drain voltage (intermediate output node 24 being driven to $V_{dd}$). As is evident from FIG. 2a, the gate voltage of transistor 22 shown by $V_{22}$ is more than a $V_t$ less than both $V_{dd}$ and voltage $V_{10}$ at output terminal 10. The use of p-channel transistor 22 allows output terminal 10 to be driven, in the steady-state, to a voltage greater than the $V_{dd}-V_t$ acheivable by n-channel output buffers constructed according to the prior art. In addition, the isolation of power supply node $C_{Vdd}$ from power supply node $D_{Vdd}$ allows the full $V_{dd}$ level to be driven in the steady-state without coupling of the transitional overshoot onto the driving power supply node.

It should be noted that while FIG. 2a shows the driving of intermediate output node 24 by transistor 22 beginning at a time ($t_6$) which is later than the cutoff of drive from transistor 8 (t₅), n-channel transistor 21b can be sized such that transistor 22 is turned on prior to the cutoff of transistor 8. The disadvantage of such an adjustment is that noise on power supply node D$_{Vdd}$ could couple through transistor 8, resistor 26 and transistor 22, transistors 22 and 28 being on, resulting in noise at power supply node C$_{Vdd}$. As will be discussed below, one of the benefits of the output buffer shown in FIG. 1 is that parallel output buffers, sharing power supply node C$_{Vdd}$, can be accomplished so that the transition noise appearing at power supply node D$_{Vdd}$ of one output buffer will not appear at power supply node C$_{Vdd}$ of a neighboring output buffer which is remaining in a high output state. However, if n-channel transistor 21b of inverter 20 is sized so that transistor 22 is turned on prior to transistor 8 being cutoff, output terminal 10 can be driven to a full V$_{dd}$ level in a shorter period of time.

The result of the operation of the circuit shown in FIG. 1, in performing a low-to-high output transistion as shown in FIG. 2a, is to provide a first power supply node for driving the output during the initial transition period. During this initial transition period, such overshoot as may occur will be coupled only onto power supply node D$_{Vdd}$, and not onto power supply node C$_{Vdd}$, which is used in driving output terminal 10 in the steady-state. The isolation of DC-driving power supply node C$_{Vdd}$ from transition-driving power supply node D$_{Vdd}$ is especially important when a number of output buffer circuits are connected in parallel to one another. In such an arrangement, the switching noise (at power supply node D$_{Vdd}$ of such neighboring output buffers) will not be coupled onto the driving power supply node C$_{Vdd}$ for an output buffer which is maintaining a high logic level at its output during the transition of its neighbor. The amount of overshoot in a single output buffer constructed according to the invention is minimized because of the cutoff of transistor 8 at V$_{dd}$−V$_t$, and also because the driving node C$_{Vdd}$ neither receives the overshoot noise from the transition appearing at D$_{Vdd}$, nor generates significant overshoot itself because of its slower transition response.

It should be noted that the size, and thereby the drive capability, of transistors 8 and 22 can be adjusted to more quickly or more slowly charge output terminal toward V$_{dd}$ when each of the transistors is turned on. In addition, by adjusting the relative sizes of transistors 21a and 21b in inverter 20, the delay time between data signal DATA making its high-to-low transition and transistor 22 turning on may similarly be adjusted. As a result, the voltage versus time waveform of output terminal 10 making its low-to-high transition may be shaped by the circuit designer. A preferred circuit design would have transistor 8 relatively large so that output terminal 10 may be quickly charged to a voltage of V$_{dd}$−V$_t$, and would have the delay through inverter 20 timed to minimize the time at which the voltage of output terminal 10 is flat at V$_{dd}$−V$_t$. Such a design would provide the fastest switching time. In addition, transistor 22 can also be sized so that its drive capability is less than that of transistor 8, further providing a slower transition and less noise after transistor 22 turns on: the slow transition of transistor 22 has little adverse impact on the circuit, since the higher drive transistor 8 has already driven output terminal 10 close to the desired level by the time transistor 22 turns on. However, in order to optimize the circuit for various design goals, such as minimizing RFI generated from the switching of output terminal 10, the output buffer circuit according to the invention allows the circuit designer significant freedom in shaping the waveform of the low-to-high transition.

Figure 2B:
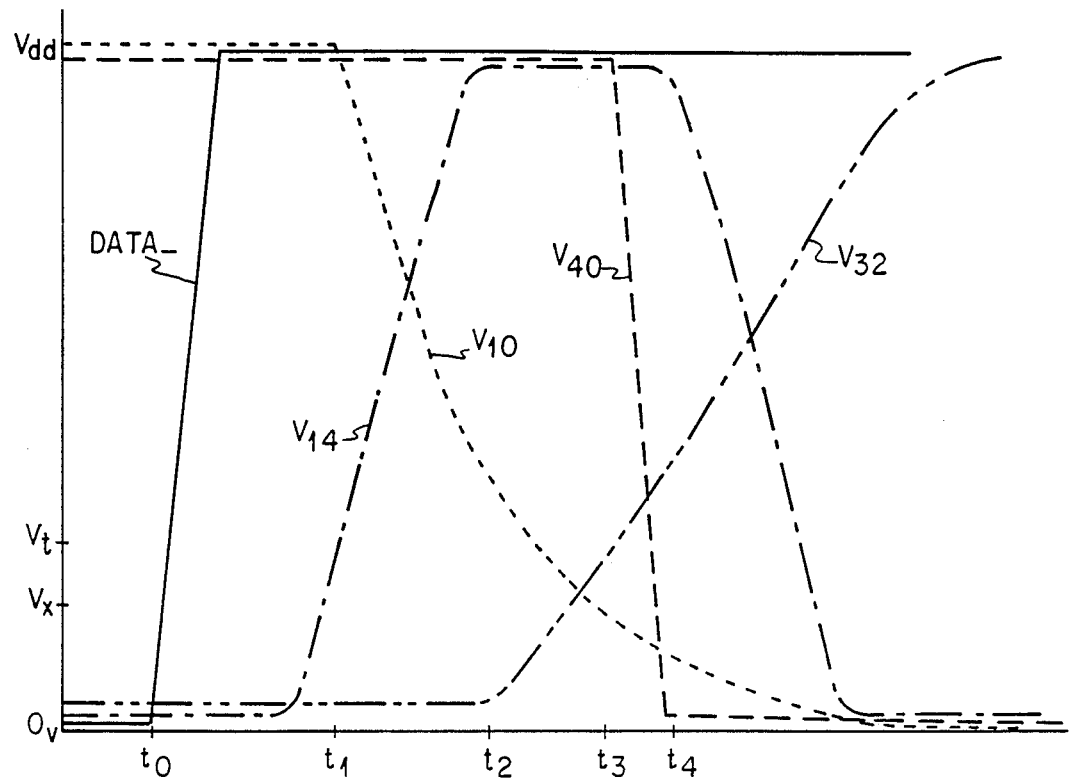
FIG. 2b is a timing diagram, representative of voltage over time, illustrating the operation of the output buffer circuit of FIG. 1 in the case where the output goes from a high logic state to a low logic state.

Referring now to FIG. 2b, the operation of the buffer circuit shown in FIG. 1 will be discussed in the case of the output going from a high logic level to a low logic level. As data signal DATA__ goes from a low logic level to a high logic level, as shown in FIG. 2b as beginning at time t₀, the output of NAND gate 6 will go from a high logic level to a low logic level, causing the voltage at the gate of transistor 14, representative of data signal DATA twice-inverted and shown in FIG. 2b as by the waveform labeled V$_{14}$, to also make a low-to-high transition. As discussed above, p-channel pull-up transistor 21a is relatively large, so that as data signal DATA__ makes its low-to-high transition, transistor 22 will be quickly turned off; this prevents the OC current path from C$_{Vdd}$ to D$_{Vss}$ which would otherwise occur if both transistor 22 and transistor 14 were on at the same time, similarly as the situation discussed above relative to FIG. 2a where transistor 32 is turned off before transistor 8 is turned on. The voltage at the gate of transistor 22 is not shown in FIG. 2b, but because of p-channel transistor 21a, transistor 22 is turned off well before transistor 14 is turned on at time t₁. Since transistor 32 is turned off when output terminal 10 is in a high state, intermediate output node 24 is left floating during this time.

Once the voltage at the gate of transistor 14 exceeds V$_t$, transistor 14 turns on, and pulls output terminal to V$_{ss}$ via reference node D$_{Vss}$; this is shown in FIG. 2b by waveform V$_{10}$ beginning to be pulled low at time t₁. The voltage of output terminal 10 will continue to fall to a level below the switching voltage of inverter 38. As dicussed above, the transistors comprising inverter 38 are sized, with n-channel transistor 44 being significantly larger than p-channel transistor 42, such that the switching voltage of inverter 38 is closer to the voltage of C$_{Vss}$ than to the voltage of C$_{Vdd}$; this voltage is represented in FIG. 2b as V$_x$. At time t₃ in FIG. 2b, the voltage V$_{10}$ of output terminal 10 drops below V$_x$, causing the output of inverter 38 to make a low-to-high transition (n-channel transistor 34 being turned on by its gate being at V$_{dd}$), and thereby presenting a low logic state at the output of inverter 40; the voltage at the output of inverter 40 is shown in FIG. 2b as the waveform labeled V$_{40}$. This causes the output of NAND gate 6 to switch from a low to a high logic state, which in turn via inverter 12 causes the voltage at the gate of transistor 14 to be pulled low, turning transistor 14 off, as shown in FIG. 2b by the falling of waveform V$_{14}$ after time t₄. Thus drive transistor 14 is turned off a period of time after it has pulled output terminal 10 from a high to a low state, isolating reference supply node D$_{Vss}$ from the remainder of the output buffer circuit.

By the time that transistor 14 is turned off by the feedback of the voltage of output terminal 10, however, transistor 32 is turned on, and continues to pull output terminal 10 toward V$_{ss}$ via reference supply node C$_{Vss}$. As discussed above, p-channel pull-up transistor 31a is relatively small, which causes a delay in the charging of the gate of transistor 32 after data signal DATA__ makes its low-to-high transition. This delay allows transistor 14 to quickly pull output terminal 10 most of the way to V$_{ss}$ through reference supply node D$_{Vss}$, while reference supply node C$_{Vss}$ is isolated from the transition by transistor 32 remaining turned off. After this delay due to the small size of p-channel transistor 31a in inverter 30, the voltage at the gate of transistor 32 is pulled above the threshold voltage $V_t$ (as shown in FIG. 2b by the waveform labeled $V_{32}$ exceeding $V_t$ at time $t_3$) and transistor 32 begins also pulling output terminal 10 low, through resistor 26. Transistor 32 will remain on, after transistor 14 is turned off, and will continue to sink OC current from output terminal 10 to $V_{ss}$ via reference supply node $C_{Vss}$.

Similarly as is the case with the low-to-high transition of the output of the output buffer circuit constructed according to the invention, undershoot occurring as output terminal 10 makes its high-to-low transition is isolated from the OC supply node, allowing a number of similar output buffer circuits to be connected in parallel without noise from a high-to-low transition (appearing at reference supply node $D_{Vss}$) affecting the operation of output buffers which are holding their output at a low logic level. Since transistor 14 is turned off for an output buffer in the steady state, any noise appearing at reference supply node $D_{Vss}$ will not appear at reference supply node $C_{Vss}$. The sinking of output terminal 10 by transistor 32 can also be made relatively noise-free by making transistor 32 sufficiently small thereby cutting down its drive capability; a small transistor 32 does not greatly affect the speed of operation of the output buffer, since larger transistor 14 operates to do the bulk of the discharging of output terminal 10 in rapid fashion.

As in the case of the low-to-high transition of output terminal 10, the output waveform in the high-to-low transition may be shaped by the circuit designer using the output buffer according to the invention. Transistors 14 and 32 may be sized to shape the slope of the output waveform for such time as they each are discharging output terminal 10; as discussed above, a preferred arrangement for a fast switching time and minimal noise is to have transistor 14 a large transistor, and transistor 32 a relatively small transistor. The circuit designer can also set switching voltage $V_x$ to a predetermined level, which will determine the point at which transistor 14 will be turned off; in addition, the sizes of transistors 31a and 31b can be adjusted to set the time at which transistor 32 is turned on after data signal DATA— makes its low-to-high transition. Again, depending upon the needs of the circuit designer, such as minimizing RFI, the output circuit according to the invention allows a great deal of flexibility in shaping the high-to-low voltage waveform at output terminal 10.

A problem may arise in the event that a load connected to output terminal 10 pulls the high logic level at output terminal 10 from near $V_{dd}$ to a voltage which turns both transistor 42 and transistor 44 of inverter 38 on, causing a DC current path and undesired power dissipation through Inverter 38. As long as the input of inverter 38 is at a high logic level, though, the output of inverter 38 will be at a low logic level. This turns on p-channel transistor 36, which pulls the input of inverter 38 to $V_{dd}$ at power supply node $C_{Vdd}$. With the input of inverter 38 held near $V_{dd}$ by p-channel transistor 36, the output of inverter 38 will be held at a low level, thereby holding transistor 36 fully on. As a result, the input voltage of inverter 38 will be held away from a voltage which causes both p-channel transistor 42 and n-channel transistor 44 to conduct. The gate of transistor 34 is also near $V_{dd}$, via inverter 4, so that transistor 34 effectively operates as a diode. Small deviations of the voltage of output terminal 10 (within the threshold voltage of transistor 34) will therefore not cause significant current to be drawn from transistor 36 to output terminal 10.

Resistor 26, connected between intermediate output node 24 and output terminal 10 is not necessary for the operation of the output buffer according to the invention, but is helpful in reducing the coupling of the switching noise transients from output terminal 10 to either power supply node $C_{Vdd}$ or reference supply node $C_{Vss}$, depending upon whether transistor 32 or transistor 22 is turned on. It should also be noted that, even if neither transistor 22 or transistor 32 is turned on, noise on intermediate output node 24 can couple to power supply node $C_{Vdd}$ and reference supply node $C_{Vss}$ capacitively through the source-to-drain capacitance of transistors 22 and 32; the presence of resistor 26, damping the noise received by intermediate output node 24 from output terminal 10, serves to reduce the noise coupled by this effect as well.

Resistor 16 is important in reducing the noise of a high-to-low output transition when a number of output buffers are connected in parallel to power supply nodes $D_{Vdd}$ and $D_{Vss}$. When a number of output buffers are connected in parallel at power supply node $D_{Vss}$, those making a high-to-low transition at the output will be driving a circuit which has an effective resistance of the source-to-drain resistances of transistors 14 in parallel. With this resistance in parallel, it becomes quite small, which reduces the damping effect of the source-to-drain resistance of transistor 14. Resistor 16 is useful in increasing the effective source-to-drain resistance of output buffers which share reference supply node $D_{Vss}$, so that the damping of the switching noise is thereby increased. This problem is reduced on the pull-up side (i.e., transistor 8), since n-channel transistor 8 cuts off as the voltage of output terminal 10 increases to within a $V_t$ of the voltage of power supply node $D_{Vdd}$; as transistor 8 cuts off, its source-to-drain resistance increases accordingly, providing not only a reduced drive during overshoot, but also an increased damping resistance. A resistor such as resistor 16 is therefore not necessary on the pull-up side of output terminal 10.

Enable signal ENABLE— allows the output buffer circuit of the invention to place output terminal 10 in a high-impedance condition. At any time that enable signal ENABLE— is at a high logic state, indicating the disable condition of the output buffer, the output of NOR gate 2 will be a low logic state, regardless of the value of data signal DATA—, which will turn off transistor 8. Similarly, the output of NAND gate 6 will also be at a high logic state whenever enable signal ENABLE— is at a high logic state, due to inverter 4. Inverter 12 will thus cause transistor 14 to be turned off when enable signal ENABLE— is at a high state. Enable signal ENABLE— in its high logic state thus turns off both of the switching drive transistors 8 and 14.

The output of NOR gate 18 also goes to a low logic state responsive to enable signal ENABLE— being at a high logic state, regardless of the logic state of data signal DATA—. As discussed above, the p-channel pull-up transistor of inverter 20 is relatively large, so that inverter 20 will quickly turn off p-channel transistor 22 responsive to the output of NOR gate 18 going low. Similarly, the output of NAND gate 28 goes to a high state responsive to enable signal ENABLE— going to a high state, due to inverter 4. Also as discussed above, the n-channel pull-down transistor of inverter 30 is sized such that transistor 32 is quickly turned off when the output of NAND gate 28 makes a low-to-high logic transition. With transistors 8, 14, 22 and 32 all turned off, output terminal 10 is left floating by the output buffer circuit shown in FIG. 1, and presents a high impedance to other circuits connected to output terminal 10. Transistor 34 is also turned off by enable signal ENABLE— being at a high logic state, since the output of inverter 4 is low, insuring that output terminal 10 is isolated from the feedback circuit of inverters 38 and 40.

The ability to float output terminal 10 allows multiple output buffers to be connected to a common output terminal 10, with the enable signal ENABLE— serving to select and not select the desired output buffer circuits. A device utilizing the output buffer shown in FIG. 1 can also be constructed with a common input-/output terminal at output terminal 10, with enable signal ENABLE— in its low logic state enabling output through output terminal 10, and in its high logic state enabling input data to be presented to an input buffer (not shown) via output terminal 10 without a data conflict from the data state of the output buffer circuit.

Although the invention has been described in detail herein with reference to its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this description. It is contemplated that such changes and additional embodiments are within the spirit and scope of the invention as hereinafter claimed.

We claim:

1. An MOS logic circuit, having an input and having an output, and adapted for driving its output to a logic state responsive to the logic state received by its input, comprising:

a first MOS transistor, having its source-to-drain path connected between a first power supply node and the output node of the logic circuit, and having its gate coupled to the input of the logic circuit so that its source-to-drain path is conductive responsive to said input of said logic circuit being at a first logic state;

a second MOS transistor, having its source-to-drain path connected between the output node of the logic circuit and a first reference supply node, and having its gate coupled to the input of the logic circuit so that its source-to-drain path is conductive responsive to said input of said logic circuit being at a second logic state;

a third MOS transistor, having its source-to-drain path connected between the output node of the logic circuit and a second power supply node;

a fourth MOS transistor, having its source-to-drain path connected between the output node of the logic circuit and a second reference supply node;

a first delay means, connected between said input to said logic circuit and the gate of said third MOS transistor, for communicating the state of said input to said gate of said third MOS transistor so that the source-to-drain path of said third MOS transistor is conductive at a predetermined time after said input of said logic circuit is at said first logic state, said third MOS transistor charging said output of said circuit to a voltage which turns off said first MOS transistor;

a second delay means, connected between said input to said logic circuit and the gate of said fourth MOS transistor, for communicating the state of said input to said fourth MOS transistor so that the source-to-drain path of said fourth MOS transistor is conductive a predetermined time after the said input of said logic circuit is at said second logic state; and turn-off means, connected to the gate of said second MOS transistor, for turning off said second MOS transistor approximately as said source-to-drain path of said fourth MOS transistor becomes conductive responsive to said input of said logic circuit being at said second logic state;

wherein said first and second power supply nodes are at substantially the same voltage;

and wherein said first and second reference supply nodes are at substantially the same voltage, said voltage of said first and second reference supply nodes representative of a different logic state than that represented by the voltage of said first and second power supply nodes.

2. The circuit of claim 1, wherein said third MOS transistor has an opposite conductivity type from said first MOS transistor;

and wherein said first delay means is inverting.

3. The circuit of claim 2, wherein said turn-off means comprises:

a feedback circuit connecting the output of said logic circuit to said gate of said second MOS transistor, so that said second MOS transistor is turned off responsive to said voltage of said output reaching substantially the voltage of said first reference supply node.

4. The circuit of claim 1, further comprising a resistor connected in series between said output node and said second MOS transistor.

5. The circuit of claim 1, wherein said first delay means comprises:

a first inverter having its input coupled to said input of said logic circuit, and having its output coupled to the gate of said third MOS transistor;

and wherein said second delay means comprises:

a second inverter having its input coupled to said input of said logic circuit, and having its output coupled to the gate of said fourth MOS transistor.

6. The circuit of claim 1, further comprising:

enable input means for receiving an enable input signal, said enable input signal having a first logic state and a second logic state; and disable logic, connected to said enable input means and connected in series between the input of said logic circuit and the gate of each of said first, second, third and fourth MOS transistors, for communicating the state of said input to said gates of said MOS transistors responsive to said enable input signal being at its first logic state, and for turning off each of said first, second, third and fourth MOS transistors responsive to said enable input signal being at its second logic state.

7. In an MOS output buffer circuit having an input node for receiving a logic signal having a first logic state and a second logic state, a first power supply node, a first reference supply node having a voltage representative of a different logic state from that represented by the voltage of said first power supply node, an output node, a first MOS transistor having its source-to-drain path connected between said first power supply node and said output node and having its gate coupled to said input node so that said first power supply node is connected to said output node responsive to said input node being at its first logic state, and a second MOS transistor having its source-to-drain path connected between said output node and said first reference supply node and having its gate coupled to said input node so that said first reference supply node is connected to said output node responsive to said input node being at its second logic state, said logic circuit thereby driving said output node to a voltage responsive to said logic state received by said input node, the improvement comprising:

a second power supply node being at substantially the same voltage as said first power supply node;

a second reference supply node being at substantially the same voltage as said first reference supply node;

an intermediate output node, coupled to said output node;

a third MOS transistor, having its source-to-drain path connected between said second power supply node and said intermediate output node, and having a gate;

a fourth MOS transistor, having its source-to-drain path connected between said second reference supply node and said intermediate output node, and having a gate;

a first coupling means for coupling said input node to said gate of said third MOS transistor in such a manner that said second power supply node is connected to said intermediate output node by said third MOS transistor at a predetermined delay time after said input node reaches its first logic state so that said output node is charged from said second power supply node to a voltage within a transistor threshold voltage of the voltage at the gate of said first MOS transistor;

a second coupling means for coupling said input node to said gate of said fourth MOS transistor in such a manner that said second reference supply node is connected to said intermediate output node by said fourth MOS transistor at a predetermined delay time after said input node reaches its second logic state; and means, connected to the gate of said second MOS transistor, for turning off said second MOS transistor responsive to the voltage of said output node approaching the voltage of said first reference supply node.

8. The improved output buffer of claim 7, wherein said intermediate output node is coupled to said output node by a resistor.

9. The improved output buffer of claim 7, wherein said first coupling means comprises:

a first inverter, having its output connected to the gate of said third MOS transistor and having its input coupled to said input node so that, responsive to said input node going from second logic state to said first logic state, said third MOS transistor connects said second power supply node to said intermediate output node after a predetermined delay time;

and wherein said second coupling means comprises:

a second inverter, having its output connected to the gate of said fourth MOS transistor and having its input coupled to said input node so that, responsive to said input node going from said first logic state to said second logic state, said fourth MOS transistor connects said second reference supply node to said intermediate output node after a predetermined delay time.

10. The improved output buffer of claim 9, wherein said third MOS transistor is of an opposite conductivity-type than said fourth MOS transistor.

11. The improved output buffer of claim 10, wherein said third MOS transistor is of an opposite conductivity-type than said first MOS transistor.

12. The improved output buffer of claim 10, wherein said first inverter comprises:

a first inverter transistor having its gate connected to the input of said first inverter, and having its source-to-drain path connected between said second reference supply node and the output of said first inverter; and a second inverter transistor having its gate connected to the input of said first inverter, and having its source-to-drain path connected between said second power supply node and the output of said first inverter, said second inverter transistor being of a conductivity-type opposite that of said first inverter transistor, and having a higher gain than that of said first inverter transistor so that said first inverter connects said second power supply node to said gate of said third MOS transistor responsive to said input node going from its second logic state to its first logic state more quickly than said first inverter connects said second reference supply node to said gate of said third MOS transistor responsive to said input node going from its first logic state to its second logic state.

13. The improved output buffer of claim 12, wherein said second inverter comprises:

a third inverter transistor having its gate connected to the input of said second inverter, and having its source-to-drain path connected between said second power supply node and the output of said second inverter; and a fourth inverter transistor having its gate connected to the input of said second inverter, and having its source-to-drain path connected between said second reference supply node and the output of said second inverter, said fourth inverter transistor being of a conductivity-type opposite that of said third inverter transistor, and having a higher gain that that of said third inverter transistor so that said second inverter connects said second reference supply node to said gate of said fourth MOS transistor responsive to said input node going from its first logic state to its second logic state more quickly than said second inverter connects said second power supply node to said gate of said fourth MOS transistor responsive to said input node going from its second logic state to its first logic state.

* * * * *